(12) United States Patent
Jefferson et al.

(10) Patent No.: US 10,930,327 B1
(45) Date of Patent: Feb. 23, 2021

(54) MEMORY READ MASKING

(71) Applicant: Micron Technology, Inc., Boise, ID (US)

(72) Inventors: Dave Jefferson, Morgan Hill, CA (US); C. Omar Benitez, Meridian, ID (US); Yoshinori Fujiwara, Boise, ID (US); Christopher S. Wieduwilt, Boise, ID (US); Vivek Kotti, Boise, ID (US); Dennis G. Montierth, Meridian, ID (US); Joshua E. Alzheimer, Boise, ID (US); Daniel S. Miller, Boise, ID (US); Kevin G. Werhane, Kuna, ID (US); Jason M. Johnson, Nampa, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/773,824

(22) Filed: Jan. 27, 2020

(51) Int. Cl.
*G11C 7/10* (2006.01)
*G11C 29/08* (2006.01)
*G11C 7/22* (2006.01)
*G11C 29/00* (2006.01)

(52) U.S. Cl.
CPC .............. *G11C 7/1006* (2013.01); *G11C 7/22* (2013.01); *G11C 29/08* (2013.01); *G11C 29/70* (2013.01); *G11C 29/88* (2013.01); *G11C 29/883* (2013.01)

(58) Field of Classification Search
CPC ....... G11C 29/88; G11C 29/883; G11C 29/70; G11C 29/08
USPC ......................................................... 365/201
See application file for complete search history.

(56) References Cited

U.S. PATENT DOCUMENTS

| 6,195,762 B1 * | 2/2001 | Shore | G11C 7/1006 |
| | | | 714/6.13 |
| 2012/0117432 A1 * | 5/2012 | Fujisaki | G11C 29/56008 |
| | | | 714/719 |

\* cited by examiner

*Primary Examiner* — Son L Mai
(74) *Attorney, Agent, or Firm* — Holland & Hart LLP

(57) ABSTRACT

Methods, systems, and devices for memory read masking are described. In some cases, a portion of a memory device, such as a portion of a memory array, may be disabled. During a testing operation, a command for accessing one or more memory cells of the disabled portion may be received, and the associated memory cells may be attempted to be accessed. Based on attempting to access the disabled memory cells, a logic state of the disabled cells may be masked. Outputting the masked value may indicate (e.g., to a testing device) that the disabled cells pass the test (e.g., that the memory cells are valid), which may allow for the enabled memory cells and the disabled memory cells of the memory device to be tested using a single test mode.

21 Claims, 7 Drawing Sheets

MEMORY READ MASKING

BACKGROUND

The following relates generally to one or more memory systems and more specifically to memory read masking.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), static RAM (SRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
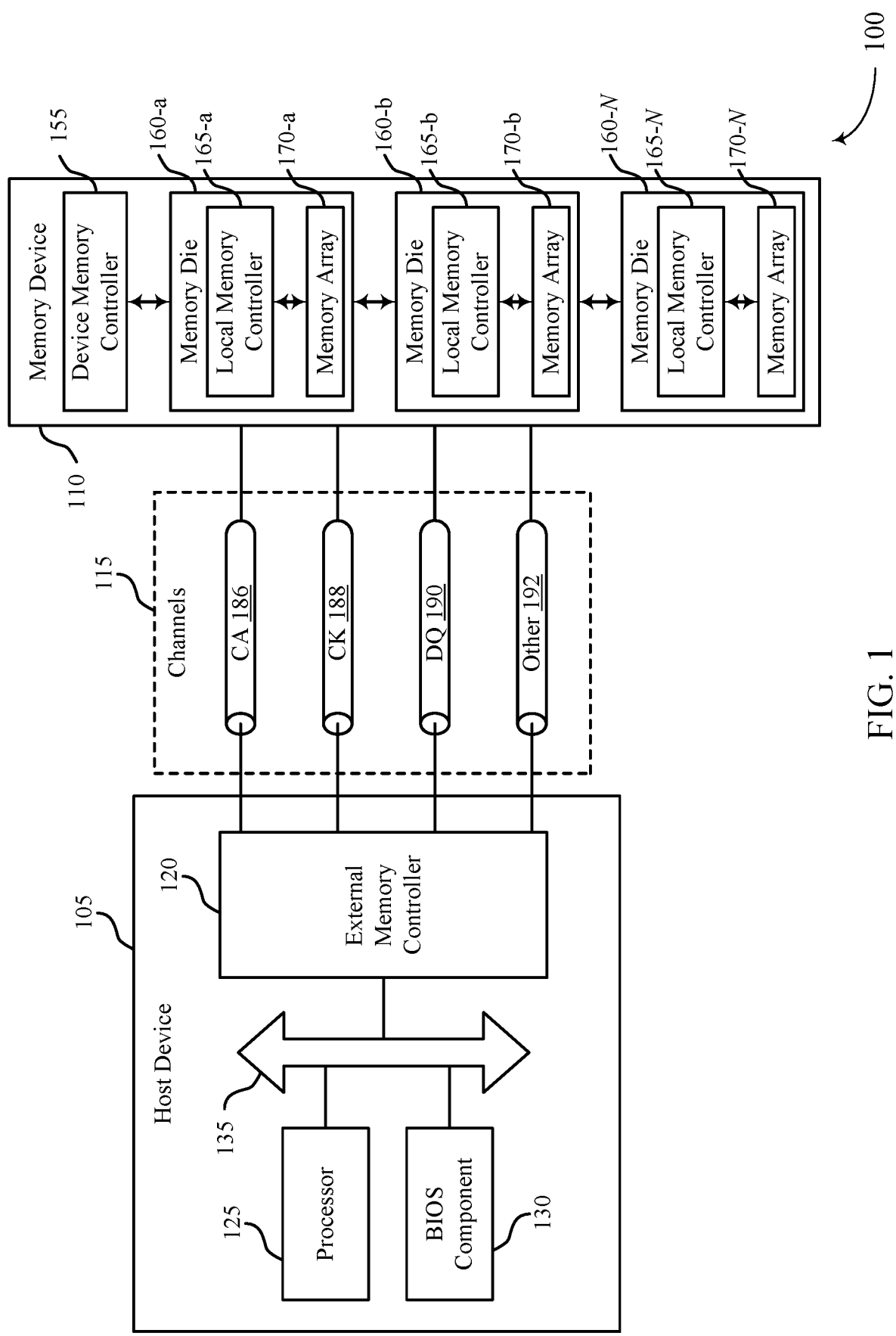
FIG. 1 illustrates an example of a system that supports memory read masking in accordance with examples as disclosed herein.

Designers and manufacturers of memory devices may test aspects of a memory device for electrical defects, such as unintended conduction paths (e.g., shorts or leakages) or disconnects (e.g., opens), for example, for quality control purposes or as part of the design process. Testing for electrical defects may be used to verify or refine device designs or device fabrication processes. Some techniques for testing for electrical defects may use a testing operation that is based on one or more characteristics of the memory device.

When a memory array is manufactured, it may contain a finite quantity of memory cells and thus a set amount of storage (e.g., 16 GB). In some examples, the majority or each of the memory cells may be available and able to store data and the corresponding memory device may be referred to as a full density (FD) memory device. An FD memory device, in some examples, may be tested using an FD-specific testing setup (e.g., to detect electrical defects). In some instances, one or more defects may be detected in one or more portions of the memory array, and these defects may in some examples render those one or more portions unavailable or unable to be used for future storage.

Half density (HD) memory devices can also be produced. A HD memory device can refer to a memory device where a first subset or threshold quantity of less than the total quantity of memory cells are enabled (e.g., a partial density (PD) memory device), available, and are able to store data and a second subset or threshold quantity of less than the total quantity of memory cells are not disabled, unavailable, and are not able to store data. Thus a HD memory device may refer to, for example, a memory device where ⅓, ½, ⅔, ¼, etc. of the total memory cells are enabled. In some examples, production may include both FD and HD memory devices. In some examples, when an FD memory device experiences errors in one or more portions (e.g., arrays), the one or more defective portions may be disabled and the FD memory device may be considered an HD memory device. In this way, converting an FD memory device to an HD memory device may allow for the active (e.g., enabled, non-defective) memory cells to still be utilized. However, using some other FD-specific testing setups to test an HD memory device may overload the testing device with numerous errors due to the disabled portion of the HD memory device being tested or may lead to running dual FD and HD testing operations, but this may add unwanted or unnecessary time to a testing operation. Thus it may be desirable to use a single test setup (e.g., an FD test setup) to test an FD memory device and an HD memory device without experiencing errors due to a portion of the memory device being disabled and without incurring the additional costs and difficulties of using dual testing modes. Improved techniques and apparatuses are disclosed herein.

One or more components of a memory system may be configured to test aspects of two memory devices using a single testing procedure (e.g., testing an HD memory device using an FD testing procedure) as described herein. The memory system may include an array of memory cells that includes some active (e.g., enabled) memory cells and some inactive (e.g., disabled) memory cells. The testing component may be configured to test the active memory cells and determine whether any electrical defects (e.g., errors) are present. The testing component may be configured to test the disabled memory cells and to mask an output associated with one or more memory cells tested. Some alternative testing techniques may ordinarily experience errors when testing disabled memory cells (e.g., particularly large groups of disabled memory cells like those that may be found in HD memory devices), which may overburden the testing component or procedure, or may lead to inaccurate results.

As described herein, however, the circuitry of a testing component or another component in the memory system may be configured to perform a testing operation associated with an enabled portion of a memory array and a disabled portion of the memory array and attempt to access the associated memory cells.

In this way, based on attempting to access the disabled memory cells, the memory system may output a forced "pass" (or "fail") result. By outputting a same result for the disabled memory cells (e.g., by masking the test results of each disabled memory cell), the testing device may not experience the errors it otherwise would when testing the disabled memory cells and thus may be used to test both HD memory devices and FD memory devices using a single technique. Further, as one example, by utilizing an FD-specific testing setup to test an HD memory device, testing efficiency may be improved by consolidating test flows while also increasing the overall yield of the memory array.

Features of the disclosure are initially described in the context of a memory system and a testing setup, as described with reference to FIGS. 1 and 2. Features of the disclosure are described in the context of timing and circuit diagrams, as described with reference to FIGS. 3 and 4. These and other features of the disclosure are further illustrated by and described with reference to an apparatus diagram and a flowchart that relate to data compression for global column repair as described with references to FIGS. 5-7.

FIG. 1 illustrates an example of a system 100 that supports memory read masking in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-$a$, local memory controller 165-$b$, local memory controller 165-N) and a memory array 170 (e.g., memory array 170-$a$, memory array 170-$b$, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package. In some examples, each memory array 170 may include one or more memory cells for testing. In some examples, a subset of a memory array 170 (a subset of the total memory cells) may be disabled and a subset of the memory array 170 (a subset of the total memory cells) may be enabled (e.g., the memory device 110 may be an HD memory device). Alternatively, one or more of the memory arrays 170 may include an FD memory device where the memory cells (or at least many of the memory cells if not all) are enabled. When testing the memory arrays 170, single test mode (e.g., applicable to HD memory devices and FD memory devices) may be utilized, which may mask the outputs of the memory cells of the disabled memory arrays 170 of the HD memory devices.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

The memory device 110 may undergo testing to determine defective memory cells. In some cases, the testing operation may occur as part of a manufacturing process of the memory device 110. During the testing operation, the memory device 110 may be coupled with a testing component (e.g., a testing component 215, as described with reference to FIG. 2). The testing component may use a single test operation (e.g., the testing component may operate in a single test mode such as an FD test mode) to test both enabled and disabled memory cells associated with one or more memory arrays 170 of the memory device 110. When testing the disabled memory cells, circuitry coupled with the memory device 110 may mask an output of the disabled memory cells. The disabled output may indicate (e.g., to the testing component) that the memory cells are active, or that the memory cells are valid (e.g., that they pass the test), or both. Thus using a single test mode to test both enabled and disabled memory cells of the memory device 110 may improve testing efficiency by consolidating test flows, and increase the overall yield of the memory device 110.

Figure 2:
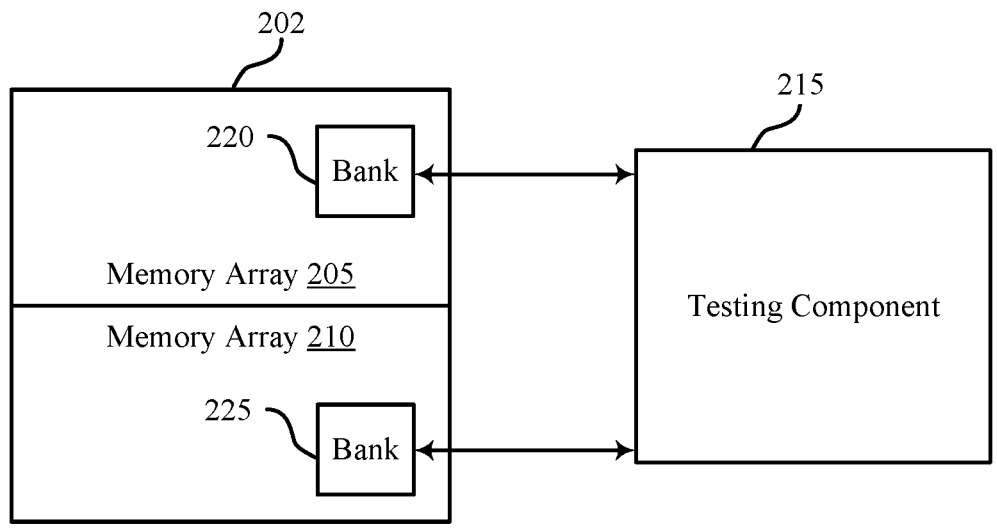
FIG. 2 illustrates an example of a testing setup that supports memory read masking in accordance with examples as disclosed herein.

FIG. 2 illustrates an example of a testing diagram 300 that supports memory read masking as disclosed herein. Testing setup 200 may involve a memory die 202 being coupled with a testing component 215. The memory die 202 may be an example of a memory die 160, as described with reference to FIG. 1. In some cases, the methods as described herein may be performed during a testing operation of the memory die 202. For example, the memory die 202 may include one or more memory arrays, such as memory array 205 and memory array 210. A portion of the memory cells of a memory array 205 or a memory array 210 may be disabled due to the occurrence of one or more errors, for example, associated with a prior testing operation. Despite a portion of the memory cells of memory array 205 or memory array 210 being disabled (e.g., and memory array 205 or memory array 210 being part of an HD memory device), a test mode that is configured to test the entire memory die 202 may be employed by the testing component 215, which may improve testing efficiency by consolidating test flows, and increase the overall yield of the memory die 202.

Memory die 202 may include one or more memory arrays, such as memory array 205 and memory array 210. The memory arrays may be subdivided into memory banks, such as memory bank 220 and memory bank 225. In some examples, each memory bank may contain a different subset of memory cells and one or more access lines (e.g., word lines or bit lines). Each access line may be coupled with at least one of the memory cells of the respective subset.

In some examples, the memory array 205 and the memory array 210 may represent different portions of the memory die 202 to be tested by the testing component 215. The testing component 215 may test the memory die 202 and may determine one or more unrepairable errors. By disabling the portion of the memory die 202 that is associated with the unrepairable errors, another portion of the memory die 202 may still be used (e.g., the memory die 202 may be converted from FD to HD). In some examples, this portion of the memory die 202 to still be used may include a mixture of some cells in the portion of the memory die 202 that is associated with the unrepairable errors as well as other memory cells in a different portion of the memory die 202.

In some examples, the memory array 205 (or a subset thereof) may be an enabled portion of the memory die 202 and the memory array 210 (or a subset thereof) may be a disabled portion of the memory die 202. Although the memory array 205 and the memory array 210 are illustrated as being a same size, the arrays may be different densities (e.g., sizes) and different quantities of memory cells can be enabled, can be disabled, or both.

As described herein, a portion (e.g., a subset, at least a portion) of the memory array 210 may be disabled. For example, during a prior testing operation, the memory array 210 may have experienced one or more errors that rendered the portion of the array defective. That is, the errors that occurred during testing may not have been repairable, thus rendering the portion of the memory array inoperable. Despite the portion of the memory array 210 being disabled, the testing component 215 may be configured to test the entire memory array 210, or memory die 202, or both. For example, when testing the disabled portion of the memory array, circuitry coupled with the memory die 202 may be configured to mask an output of the disabled portion of the memory array. The masked output may indicate to the testing component 215 that the tested memory cell(s) are operational (e.g., that the memory cell passes the test). This may allow the testing component 215 to operate in a single test mode configured to test the entire memory array 210, or the entire memory die 202, or both. In some cases, without masking the outputs of the disabled memory cells, the testing component 215 would either experience a large quantity of errors when testing the disabled cells which may lead to a failure or would be forced to test the enabled memory array using an additional test mode, which may result in the test process being less efficient.

Figure 3:
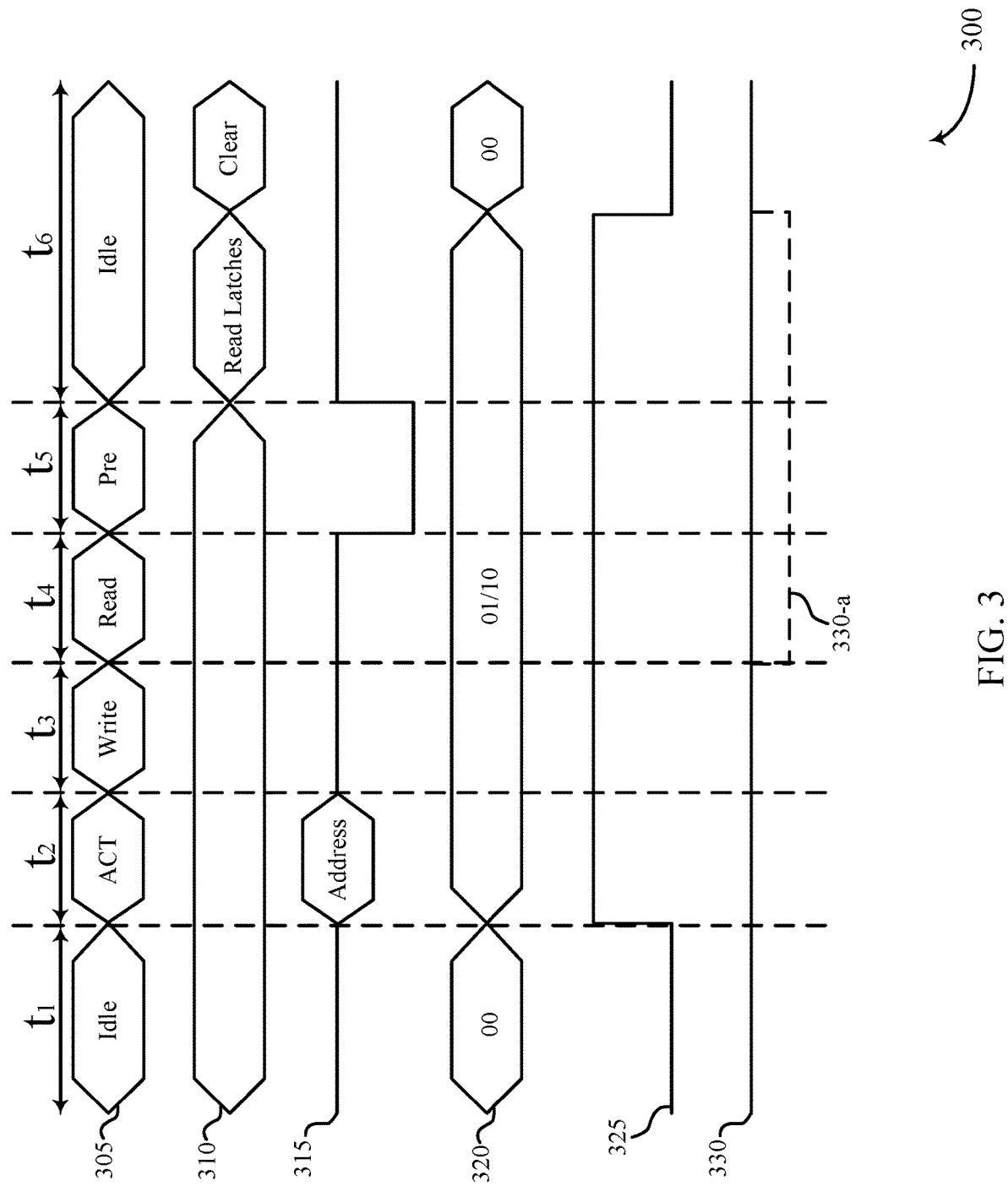
FIG. 3 illustrates an example of a timing diagram that supports memory read masking in accordance with examples as disclosed herein.

FIG. 3 illustrates an example of a timing diagram 300 that supports memory read masking in accordance with examples as disclosed herein. The timing diagram 300 may illustrate a testing operation of a memory device using a test mode, such as an FD test mode. The memory device may include one or more enabled memory cells and one or more disabled memory cells (e.g., as part of one or more memory arrays). The memory device may also be coupled with circuitry, such as circuit 400, as described with reference to FIG. 4, that may be configured to mask an output associated with the disabled memory cells. Thus, the timing diagram 300 may illustrate one or more inputs to and outputs from the circuit, such as a command string 305, an error detection signal 310 (e.g., a ErrorDetect signal), an address bit input 315 (e.g., an RA16 input), a test mode input 320 (e.g., a HdRdMask input), a test mode output 325 (e.g., an HdRd output), and an error flag output 330, among other examples. The inputs may be received from or output to, for example, a testing component (e.g., a testing component 215, as described with reference to FIG. 2). Based on the inputs to or outputs from the memory device, a test mode may be employed to test the memory device (e.g., regardless of whether the device is an FD memory device or an HD memory device), which may improve testing efficiency by consolidating test flows, among other advantages.

During time $t_1$, the memory device may operate in an idle mode. Accordingly, the circuit may receive an idle command string 305 (e.g., the memory device may not receive a command in the command string 305). While operating in an idle mode, the circuit may or may not receive an error detection signal 310, an address bit input 315, or a test mode input 320, or any combination thereof. If the circuit does receive an error detection signal 310, the address bit input 315, or the test mode input 320 during $t_1$, the test mode output 325 may remain low and the memory device may be idle. Additionally or alternatively, during $t_1$, the error flag output 330 may or may not be output from the circuit. The output may be based on, for example, a portion of the memory device being tested (e.g., whether disabled memory cells are being tested) or whether an error occurs during the test (e.g., when testing enabled memory cells). In the event that the error flag is output from the circuit, the error flag output 330 may be high (e.g., a logic "1") value. The error flag output 330 may be relevant to a testing component during a read phase (e.g., a read operation) for determining whether respective memory cells are defective.

The error detection signal 310 may indicate a type of error testing to perform. For example, the error detection signal 310 may indicate that a known compare or a blind compare is to be performed. In some examples, a known compare may refer to an operation that produces an error signal by comparing array bits to an external DQ state. Additionally or alternatively, a blind compare may refer to an operation that produces an error signal by comparing internal array bits to each other.

In some examples, the memory device may receive the address bit input 315 from a testing device (e.g., a testing component 215, as described with reference to FIG. 2). The address bit input 315 may indicate an address of a memory cell (e.g., an address of a row of memory cells) to be tested. The circuitry that receives the address bit input 315 (e.g., the circuit 400, as described with reference to FIG. 4) may mask a result of the test based on the address bit input 315 (e.g., may mask the result if the address bit input 315 is associated with a disabled portion of memory cells of a memory array). In some examples, the circuitry may mask the result of the test based on a value of the error detection signal 310 or a value of the test mode input 320 or both.

The memory device may receive the test mode input 320 from a testing component (e.g., a testing component 215, as described with reference to FIG. 2). The test mode input 320 may indicate whether the error flag output 330 may be masked. Based on a value of the test mode input 320, the circuitry that receives the test mode input 320 (e.g., the circuit 400, as described with reference to FIG. 4) may mask a result of the test if the address bit input 315 is associated with a disabled portion of memory cells.

A value of the test mode input 320 may indicate, for example, whether the circuitry forces a pass result or a fail result of the tested memory cells. For example, if the test mode input 320 indicates a value (e.g., a bit value) of 01 then the circuitry may force a pass on one or more memory cells of the disabled subset of the memory array. Additionally or alternatively, if the test mode input 320 indicates a value of 10 then the circuitry may force a fail on one or more memory cells of the disabled subset of the memory array. If the test mode input 320 indicates a different value (e.g., 00), then the circuitry may perform read operations or write operations without forcing a pass or a fail when testing the associated memory cells.

In some examples, the test mode output 325 may be based on the values of the error detection signal 310, the address bit input 315, or the test mode input 320, or any combination thereof. For example, when the test mode output 325 goes high, then the error flag output 330 may be forced high. That is, when the test mode output 325 goes high, then an output associated with testing one or more disabled memory cells may be masked.

During time $t_2$, the memory device may be activated. Accordingly, the circuit may receive an activate (e.g., an ACT) command string 305. When activated, the circuit may receive an error detection signal 310, address bit input 315, or a test mode input 320, or any combination thereof. For example, the error detection signal 310 may indicate that a blind comparison is to occur, the address bit input 315 may indicate an address of the memory device to test (e.g., an address to write to or read from), and the test mode input 320 may indicate that the error flag output 330 should indicate whether an error occurred during testing (e.g., that the error flag output 330 should not be masked), despite the memory device having one or more disabled memory cells. Based on receiving the error detection signal 310, the address bit input 315, or the test mode input 320 (or any combination thereof), the test mode output 325 from the circuit may be high. Additionally or alternatively, during $t_2$, the error flag output 330 may be output from the circuit. In the event that the error flag is output, the error flag output 330 may be high (e.g., a logic "1") value. The error flag output 330 may be relevant to a testing component during a read phase (e.g., a read operation) for determining whether respective memory cells are defective.

During time $t_3$, a write operation may be performed on the memory device. Accordingly, the circuit may receive a write command string 305. During the write operation, the memory cells associated with the received address bit input 315 (during time $t_2$) may be written to. During the write operation, the circuit may continue to receive the error detection signal 310, the address bit input 315, or the test mode input 320, or any combination thereof. Accordingly, the test mode output 325 from the circuit may continue to be high.

Additionally or alternatively, during $t_3$, the error flag output 330 may or may not be output from the circuit. That is, in some examples, the error flag output 330 may be output from the circuit only during a read operation. In the event that the error flag is output, however, the error flag output 330 may be high (e.g., a logic "1") value.

During time $t_4$, a read operation may be performed on the memory device. Accordingly, the circuit may receive a read command string 305. During the read operation, the one or more memory cells associated with the received address bit input 315 (during time $t_2$) may be read. Because the memory device may include one or more disabled memory cells, the read operation may be performed (or attempted to be performed) on one or more disabled memory cells. For example, the received address bit input 315 may be associated with one or more disabled memory cells. Despite the memory cells being disabled, the test mode input 320 may allow for an output of the read operation to be output and to be masked. Thus, the memory cells may be sensed (e.g., at an activate time) and read (e.g., at a column read time), but, based on the operation of the circuit, the error flag output 330 may indicate a high logic value (e.g., a logic "1") to the testing component, which may mask the output that would otherwise return an error.

In some examples, the high logic value may indicate that the memory cells passed the test, despite the associated memory cells being disabled. But for the circuit masking the output of the disabled memory cells, the error flag output 330-a may indicate a low logic value, which may result in the testing component encountering an error when testing each disabled memory cell. Encountering such a large quantity of errors may otherwise make testing the device impractical or require the testing component use multiple testing operations (e.g., both an FD and HD test mode as opposed to the techniques disclosed herein). Accordingly, by masking the output of the disabled memory cells, the circuit and the techniques described herein may allow for a single testing mode to be performed when testing an HD memory device and an FD memory device.

During time $t_5$, memory cells that were previously activated may be deactivated (e.g., decoupled from a respective, activated word line). Accordingly, the circuit may receive a precharge command string 305. The circuit may continue to receive the error detection signal 310 or the test mode input 320, but may no longer receive the address bit input 315. The test mode output 325 from the circuit may continue to be high due to the test mode input 320 being received. Additionally or alternatively, during $t_5$, the error flag output 330 may or may not be output from the circuit. In the event that the error flag is output, the error flag output 330 may be high (e.g., a logic "1") value.

During time $t_6$, the memory device may operate in an idle mode. Accordingly, the circuit may receive an idle command string 305 (e.g., the memory device may not receive a command in the command string 305). While operating in an idle mode, one or more error latches may be read, which may indicate errors that occurred when testing an enabled portion of the memory device. While the latches are being read, the circuit may receive the error detection signal 310, the address bit input 315, or the test mode input 320. Accordingly, the test mode output 325 from the circuit may continue to be high. Additionally or alternatively, during $t_6$, the error flag output 330 may be output from the circuit. In the event that the error flag is output, the error flag output 330 may be high (e.g., a logic "1") value.

After a flag read operation is performed on the latches, the error detection signal 310 may indicate that the current test mode is to be cleared (e.g., exited). For example, if operating in a blind compare mode, the blind compare mode may be exited and the memory array may resume or perform other operations (or may enter into, for example, a known compare mode). Accordingly, a value of the test mode input 320 may change, which may result in the test mode output 325 decreasing (e.g., to a low value). The test mode output 325 going low may indicate an end of a testing operation.

In some examples, the test mode described herein may allow for crossover repair for repairing one or more defective memory cells of the associated memory device. When performing the testing operations described herein, an entire memory array (e.g., both enabled and disabled portions) may be stressed. Accordingly, it may be desirable to test memory cells from the disabled portion. For example, one or more memory cells located in the disabled portion of the memory array may be used as an alternative to one or more memory cells located in the enabled portion of the array (for example, if a memory cell in the enabled portion fails a normal cell located in the disabled portion of the memory array may be used in its place). Such alternative memory cells may be referred to as redundant memory cells or memory cells that may be used in place of one or more memory cells located in the enabled portion of the array in some examples. By testing the disabled cells, information may be gathered regarding why the memory cells became defective and were subsequently disabled. That is, testing the disabled cells may provide information about why the cells failed. Because the disabled memory cells may be redundant with enabled memory cells, this information may be used to prevent or correct errors associated with the redundant enabled memory cells. This crossover repair may improve the overall quality of the memory device.

Figure 4:
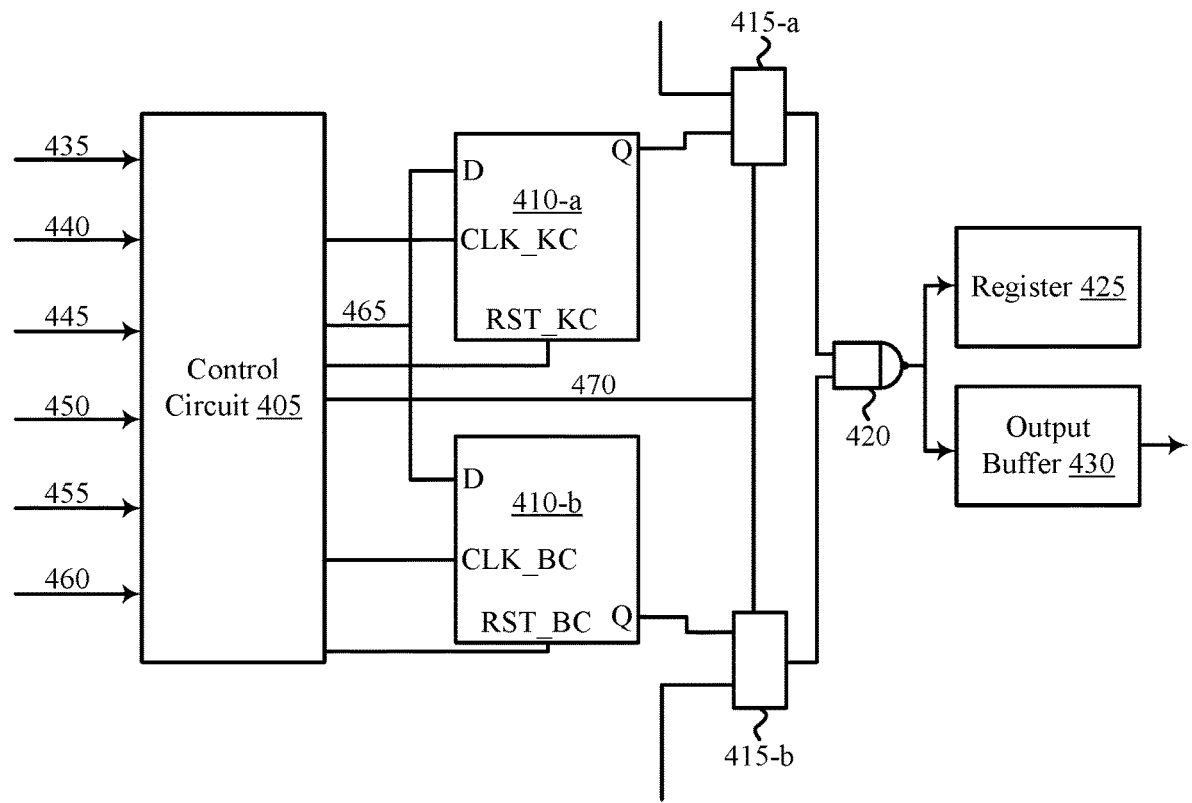
FIG. 4 illustrates an example of a circuit diagram that supports memory read masking in accordance with examples as disclosed herein.

FIG. 4 illustrates an example of a circuit 400 that supports memory read masking in accordance with examples as disclosed herein. In some examples, the circuit 400 may include a control circuit 405, a latch 410-a, a latch 410-b, a multiplexer 415-a, and a multiplexer 415-b, among other components. The latch 410-a may be referred to as a first latch 410-a, the latch 410-b may be referred to as a second latch 410-b, the multiplexer 415-a may be referred to as a first multiplexer 415-a, and the multiplexer 415-b may be referred to as a second multiplexer 415-b. The circuit 400 may also include a logic gate 420, registers 425, and an output buffer 430. In some examples, the logic gate 420 may be a NAND logic gate 420, and the output buffer 430 may be configured to output an error flag output, such as the error flag output 330, as described with reference to FIG. 3. The components of the circuit 400 may be configured for a single test mode to be used to test an FD and HD memory device, which may improve testing efficiency by consolidating test procedures.

The control circuit 405 may receive one or more signals or commands that may allow for a test mode to be used to test an HD memory device and an FD memory device. For example, the control circuit may receive an address signal 435, a density signal 440 (e.g., a MsbDensity signal), a test mode signal 445 (e.g., a HdRdMask signal), an error detection signal 450 (e.g., a ErrorDetect signal), a clock signal 455, and an activate signal 460, among other signals. With reference to FIG. 3, the address signal 435 may be an example of the address bit input 315, the test mode signal 445 may be an example of the test mode input 320, and the activate signal 460 may be an example of one or more signals received in the command string 305.

In some examples, the signals may be associated with a particular logic value (e.g., a particular bit) and, based on the signals applied to the control circuit 405, the control circuit 405 may facilitate a test operation performed on an associated memory device. The value of the density signal 440 may indicate which portion of a memory device is being tested, a value of the error detection signal 450 may indicate whether a known compare or a blind compare is being be performed on the associated memory device, and the value of the error test mode signal 445 may indicate whether an output of the circuit is to be masked.

The density signal 440 and the test mode signal 445, together, in some examples, may indicate which portion of a memory device is being tested and whether the associated output (e.g., from the test) should be masked. For example, if the density signal 440 indicates a value (e.g., a bit value) of 01 then the circuitry may perform testing on a first portion of an associated memory array. Additionally or alternatively, if the density signal 440 indicates a value of 10 then the circuitry may perform testing on a second portion of an associated memory array. If the test mode input 320 indicates a different value (e.g., 00, 11), then the circuitry may operate in a standard mode to test the entire array. Moreover, if the test mode signal 445 indicates a value of 01 or 10 then the circuitry may mask an output associated with testing a portion of the memory array (e.g., the portion indicated by the density signal 440). Additionally or alternatively, if the test mode signal 445 indicates a value of 00 or 11 then the associated output may not be masked (e.g., the output may indicate whether an error occurred during the test).

Additionally or alternatively, the address signal 435 may provide an address (e.g., a row address) of one or more memory cells to be tested. The control circuit 405 may also receive a clock signal 455 or an activate signal 460 or both. In some examples, a memory device coupled with the circuit 400 may be accessed (e.g., written to, read from) according to the clock signal 455 or based on the control circuit 405 receiving an activate signal or both. In other examples, some signals described with reference to FIG. 4 may be delayed (e.g., delayed by one or more clock cycles) relative to another signal.

The control circuit 405 may output one or more signals that may allow for an FD test mode to be used to test an HD memory device. For example, the control circuit 405 may output a test mode signal 465 and an error detection enable signal 470. The control circuit 405 may output, to the first latch 410-a and the second latch 410-b, a clock signal (CLK_KC, CLK_BC) and a reset signal (RST_KC, RST_BC). The clock signal or the reset signal or both may be output to a latch to activate the latch and store an associated logic value. Whether a respective clock signal or reset signal are output to a latch may depend on whether a known compare or a blind compare is to be performed by the circuit 400.

The latch 410-a or the latch 410-b may latch the test mode signal 465 according to the received clock signal 455. In some examples, the latch 410-a or the latch 410-b may latch the test mode signal 465 based on the clock signal 455 (e.g., the latches may be synchronous). The value latched by the latch 410-a or the latch 410-b may indicate which portion of a memory device is to be tested. For example, a high logic value (e.g., a logic "1") may indicate that a disabled portion of the memory array is being tested. Additionally or alternatively, a low logic value (e.g., a logic "0") may indicate than an enabled portion of the memory array is being tested.

In some examples, the first latch 410-a may be configured to disable the first multiplexer 415-a (e.g., the output Q from the first latch 410-a may not activate the first multiplexer 415-a) and the second latch 410-b may be configured to enable the second multiplexer 415-b (e.g., the output Q from the second latch 410-b may activate the second multiplexer 415-b). In order to enable the second multiplexer 415-b, the control circuit 405 may also transmit a reset signal (RST_BC) and a clock signal (CLK_BC) to the latch 410-b. The control circuit 405 may or may not transmit a reset signal (RST_KC) and a clock signal (CLK_KC) to the latch 410-a when the multiplexer 415-b is activated.

In other examples, the first latch 410-a may be configured to enable the first multiplexer 415-a (e.g., the output Q from the first latch 410-a activate the first multiplexer 415-a) and the second latch 410-b may be configured to disable the second multiplexer 415-b (e.g., the output Q from the second latch 410-b may not activate the second multiplexer 415-b). In order to enable the first multiplexer 415-a, the control circuit 405 may also transmit a reset signal (RST_KC) and a clock signal (CLK_KC) to the latch 410-a. The control circuit 405 may or may not transmit a reset signal (RST_BC) and a clock signal (CLK_KC) to the latch 410-b when the multiplexer 415-a is activated.

In some examples, whether the first multiplexer 415-a or the second multiplexer 415-b is activated may also depend on the value of the error detection enable signal 470. That is, the error detection enable signal 470 may serve as a select signal for the multiplexer 415-a or the multiplexer 415-b. Thus when the control circuit 405 outputs the error detection enable signal 470 the multiplexer 415-a or the multiplexer 415-b may be enabled.

Based on which of the multiplexer 415-a or multiplexer 415-b is activated, results from testing an enabled or a disabled portion of the memory array may be passed to the logic gate 420. For example, when the first multiplexer 415-a is activated, an enabled portion of the memory device may be tested and errors associated with any of the tested memory cells may be output by the register 425. Additionally or alternatively, when the second multiplexer 415-b is activated, a disabled portion of the memory device may be tested and a result of testing each of the memory cells may be masked. The respective multiplexers may receive test data (e.g., indications of whether errors occurred) associated with the portion of the array to be tested and may transmit the data to the logic gate 420.

For example, when the second multiplexer 415-b is activated, it may output a same value (e.g., a same logic value, a logic "0") regardless of what memory cell(s) is being tested. This may be because each memory cell associated with the second multiplexer 415-b is disabled. When the second multiplexer 415-b outputs this logic value (e.g., a logic "0"), the logic gate 420 may output a same value (e.g., a logic "1") regardless of the value input from the first multiplexer 415-a. Accordingly, the result of testing each of the disabled memory cells may be masked (e.g., the output buffer 430 may output a same value for each tested cell).

Additionally or alternatively, when the first multiplexer 415-a is activated, it may output a different value based on whether an associated memory cells is functional or defective. Because the second multiplexer 415-b may be disabled when the first multiplexer 415-*a* is enabled, the second multiplexer 415-*b* may output a constant logic value (e.g., a logic "1"). Thus the logic gate 420 may output a value that is an inverse of the logic value provided by the first multiplexer 415-*a*. For example, a memory cell may be determined to be defective, which may be associated with a logic "1" value. The logic gate 420 may output a logic "0" to either the register 425 or the output buffer 430, which may indicate that the memory cell is defective (e.g., by outputting an error flag with a low logic value). In other examples, the logic gate 420 may output a logic "1" to either the register 425 or the output buffer 430, which may indicate that the memory cell is not defective (e.g., by outputting an error flag with a high logic value). Accordingly, the circuit 400 may allow for an HD memory device and an FD memory device to be tested using a single test operation, such as an FD test operation.

Figure 5:
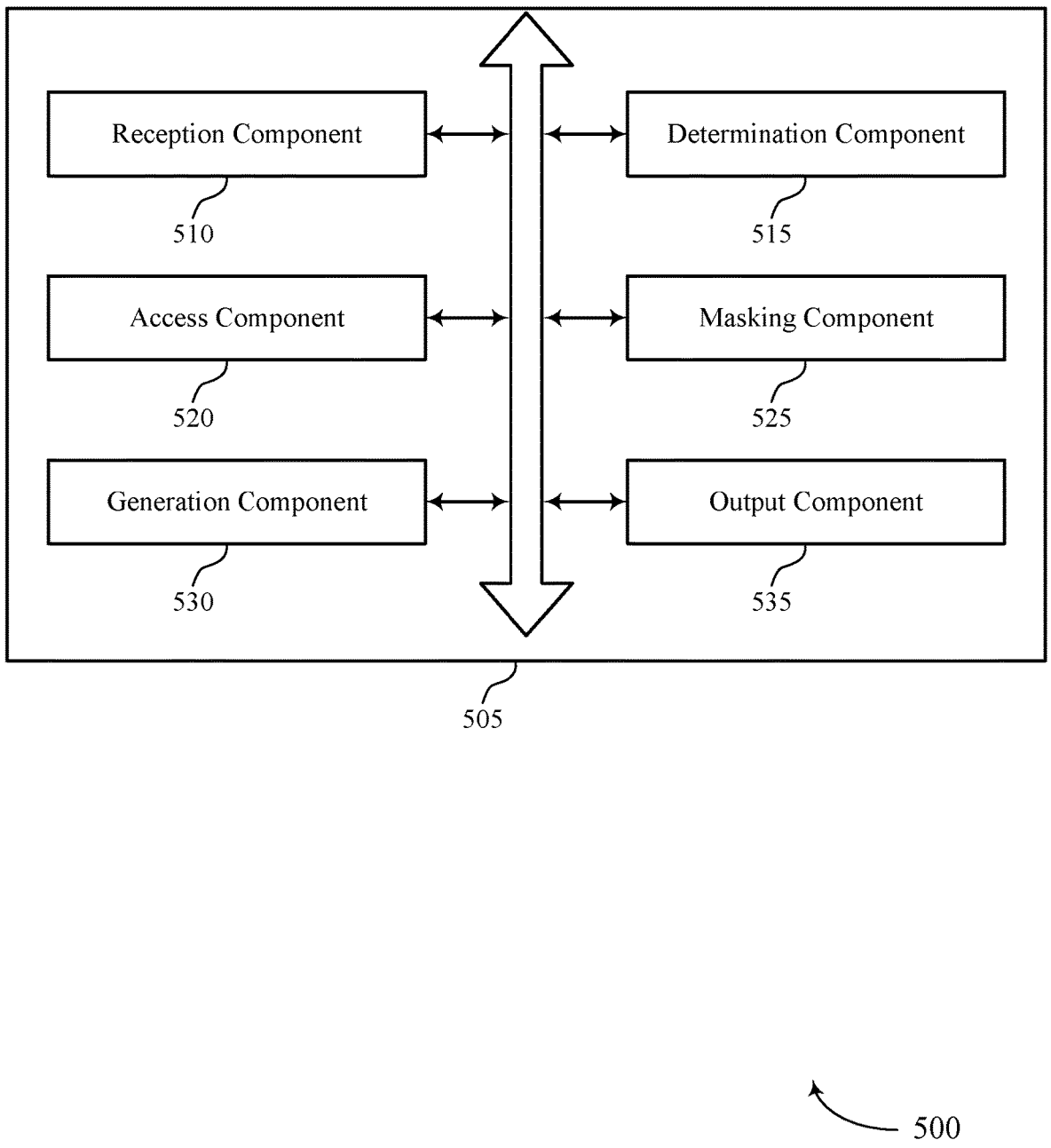
FIG. 5 shows a block diagram of a memory array that supports memory read masking in accordance with examples as disclosed herein.

FIG. 5 shows a block diagram 500 of a memory device 505 that supports memory read masking in accordance with examples as disclosed herein. The memory device 505 may be an example of aspects of a memory device or testing component, as described with reference to FIGS. 2-4. The memory device 505 may include a reception component 510, a determination component 515, an access component 520, a masking component 525, a generation component 530, and an output component 535. Each of these modules may communicate, directly or indirectly, with one another (e.g., via one or more buses).

The reception component 510 may receive, at a memory array, a command for accessing one or more memory cells of the memory array, where the memory array includes a subset of enabled memory cells and a subset of disabled memory cells. In some examples, the reception component 510 may receive, at the memory array, a control signal including one or more bits. In some examples, the reception component 510 may receive, at the memory array, a second command for accessing one or more memory cells of the subset of enabled memory cells. In some examples, the reception component 510 may receive, at the memory array, a third command for accessing one or more memory cells of the memory array.

The determination component 515 may determine that the command is associated with accessing one or more memory cells of the subset of disabled memory cells. In some examples, the determination component 515 may determine a row address associated with the command, where determining that the command is associated with accessing one or more memory cells of the subset of disabled memory cells is based on determining the row address.

In some examples, the determination component 515 may determine a value of the one or more bits received by the memory array, where masking the output of the logic state of the one or more memory cells is based on the row address associated with the command and the value of the one or more bits. In some examples, the determination component 515 may determine a first memory cell of the subset of disabled memory cells that is available for being used to store a logic state in place of a first memory cell of the subset of enabled memory cells.

In some examples, the determination component 515 may determine that the first memory cell of the subset of disabled memory cells is valid based on attempting to access the one or more memory cells of the subset of disabled memory cells. In some examples, the determination component 515 may determine that the third command is associated with accessing one or more memory cells of the subset of enabled memory cells.

The access component 520 may attempt to access the one or more memory cells of the subset of disabled memory cells based on determining that the command is associated with accessing the one or more disabled memory cells. In some examples, the access component 520 may access the first memory cell of the subset of disabled memory cells based on determining that the first memory cell of the subset of disabled memory cells is valid. In some examples, the access component 520 may access the one or more memory cells of the subset of enabled memory cells based on determining that the command is associated with accessing the one or enabled more memory cells. In some examples, the access component 520 may access, for a second time, the one or more memory cells of the subset of enabled memory cells based on outputting the logic state of the one or more memory cells associated with the command.

The masking component 525 may mask an output of a logic state of the one or more memory cells associated with the command based on attempting to access the one or more memory cells of the subset of disabled memory cells.

The generation component 530 may generate an indication that the one or more memory cells were successfully accessed.

The output component 535 may output a logic state of the one or more memory cells associated with the command based on accessing the one or more memory cells of the subset of enabled memory cells.

Figure 6:
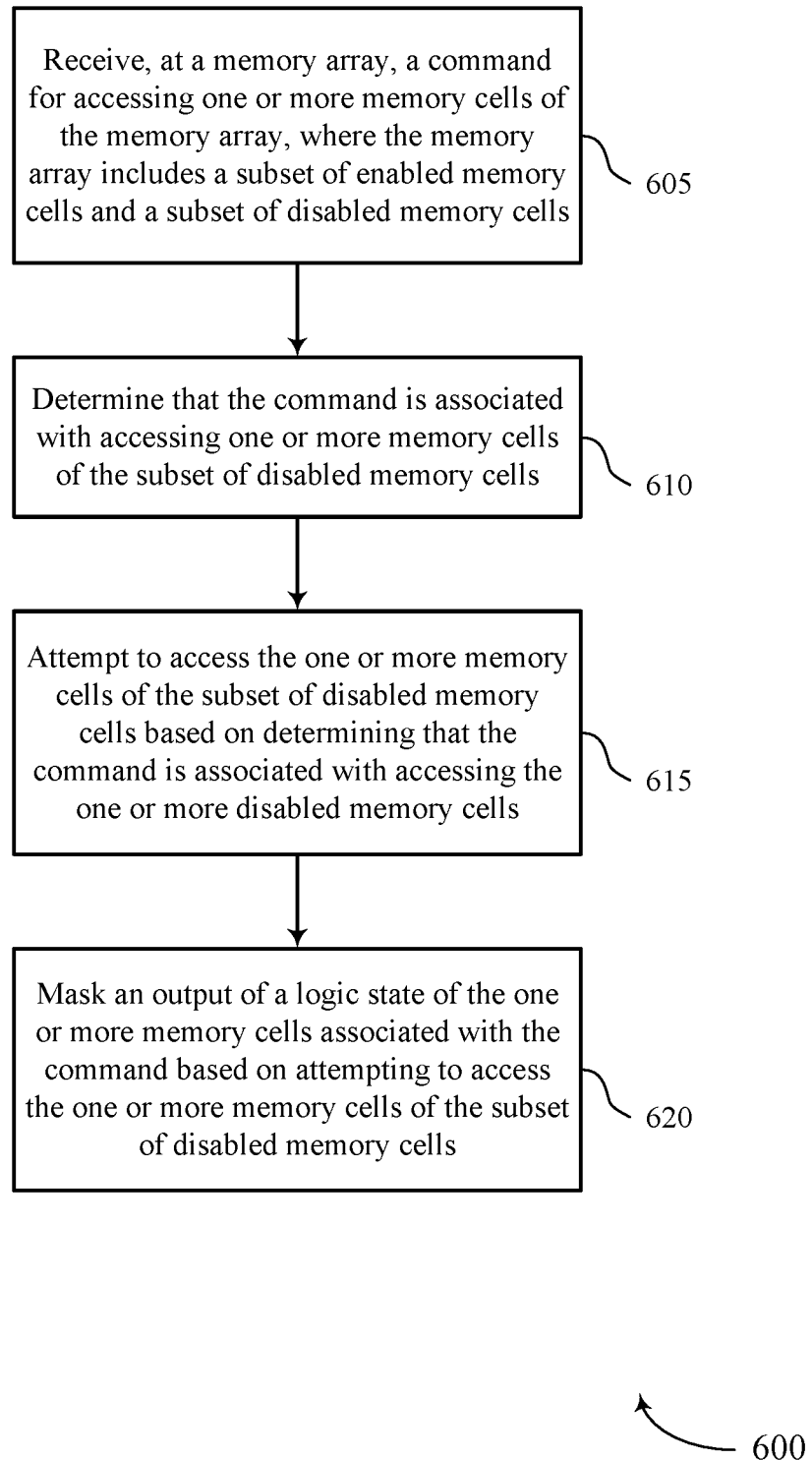
FIGS. 6 and 7 show flowcharts illustrating a method or methods that support half density read mask in accordance with examples as disclosed herein.

FIG. 6 shows a flowchart illustrating a method or methods 600 that supports memory read masking in accordance with examples as disclosed herein. The operations of method 600 may be implemented by a memory device or its components as described herein. For example, the operations of method 600 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 605, the memory device may receive, at a memory array, a command for accessing one or more memory cells of the memory array, where the memory array includes a subset of enabled memory cells and a subset of disabled memory cells. The operations of 605 may be performed according to the methods described herein. In some examples, aspects of the operations of 605 may be performed by a reception component as described with reference to FIG. 5.

At 610, the memory device may determine that the command is associated with accessing one or more memory cells of the subset of disabled memory cells. The operations of 610 may be performed according to the methods described herein. In some examples, aspects of the operations of 610 may be performed by a determination component as described with reference to FIG. 5.

At 615, the memory device may attempt to access the one or more memory cells of the subset of disabled memory cells based on determining that the command is associated with accessing the one or more disabled memory cells. The operations of 615 may be performed according to the methods described herein. In some examples, aspects of the operations of 615 may be performed by an access component as described with reference to FIG. 5.

At 620, the memory device may mask an output of a logic state of the one or more memory cells associated with the command based on attempting to access the one or more memory cells of the subset of disabled memory cells. The operations of 620 may be performed according to the methods described herein. In some examples, aspects of the operations of 620 may be performed by a masking component as described with reference to FIG. 5.

In some examples, an apparatus as described herein may perform a method or methods, such as the method 600. The apparatus may include features, means, or instructions (e.g., a non-transitory computer-readable medium storing instructions executable by a processor) for receiving, at a memory array, a command for accessing one or more memory cells of the memory array, where the memory array includes a subset of enabled memory cells and a subset of disabled memory cells, determining that the command is associated with accessing one or more memory cells of the subset of disabled memory cells, attempting to access the one or more memory cells of the subset of disabled memory cells based on determining that the command is associated with accessing the one or more disabled memory cells, and masking an output of a logic state of the one or more memory cells associated with the command based on attempting to access the one or more memory cells of the subset of disabled memory cells.

In some examples of the method 600 and the apparatus described herein, the masked output of the logic state includes an indication that an error did not occur based on attempting to access the one or more memory cells of the subset of disabled memory cells.

In some examples of the method 600 and the apparatus described herein, masking the output of the logic state of the one or more memory cells associated with the command may include operations, features, means, or instructions for generating an indication that the one or more memory cells were successfully accessed.

Some examples of the method 600 and the apparatus described herein may further include operations, features, means, or instructions for determining a row address associated with the command, where determining that the command may be associated with accessing one or more memory cells of the subset of disabled memory cells may be based on determining the row address.

Some examples of the method 600 and the apparatus described herein may further include operations, features, means, or instructions for receiving, at the memory array, a control signal including one or more bits, and determining a value of the one or more bits received by the memory array, where masking the output of the logic state of the one or more memory cells may be based on the row address associated with the command and the value of the one or more bits.

Some examples of the method 600 and the apparatus described herein may further include operations, features, means, or instructions for determining a first memory cell of the subset of disabled memory cells that may be available for being used to store a logic state in place of a first memory cell of the subset of enabled memory cells, and determining that the first memory cell of the subset of disabled memory cells may be valid based on attempting to access the one or more memory cells of the subset of disabled memory cells.

Some examples of the method 600 and the apparatus described herein may further include operations, features, means, or instructions for receiving, at the memory array, a second command for accessing one or more memory cells of the subset of enabled memory cells, and accessing the first memory cell of the subset of disabled memory cells based on determining that the first memory cell of the subset of disabled memory cells may be valid.

Some examples of the method 600 and the apparatus described herein may further include operations, features, means, or instructions for generating, based on determining that the command may be associated with the subset of disabled memory cells, a signal that includes the masked output of the logic state of the one or more memory cells.

Some examples of the method 600 and the apparatus described herein may further include operations, features, means, or instructions for receiving, at the memory array, a third command for accessing one or more memory cells of the memory array, determining that the third command may be associated with accessing one or more memory cells of the subset of enabled memory cells, accessing the one or more memory cells of the subset of enabled memory cells based on determining that the command may be associated with accessing the one or enabled more memory cells, and outputting a logic state of the one or more memory cells associated with the command based on accessing the one or more memory cells of the subset of enabled memory cells.

Some examples of the method 600 and the apparatus described herein may further include operations, features, means, or instructions for accessing, for a second time, the one or more memory cells of the subset of enabled memory cells based on outputting the logic state of the one or more memory cells associated with the command.

Figure 7:
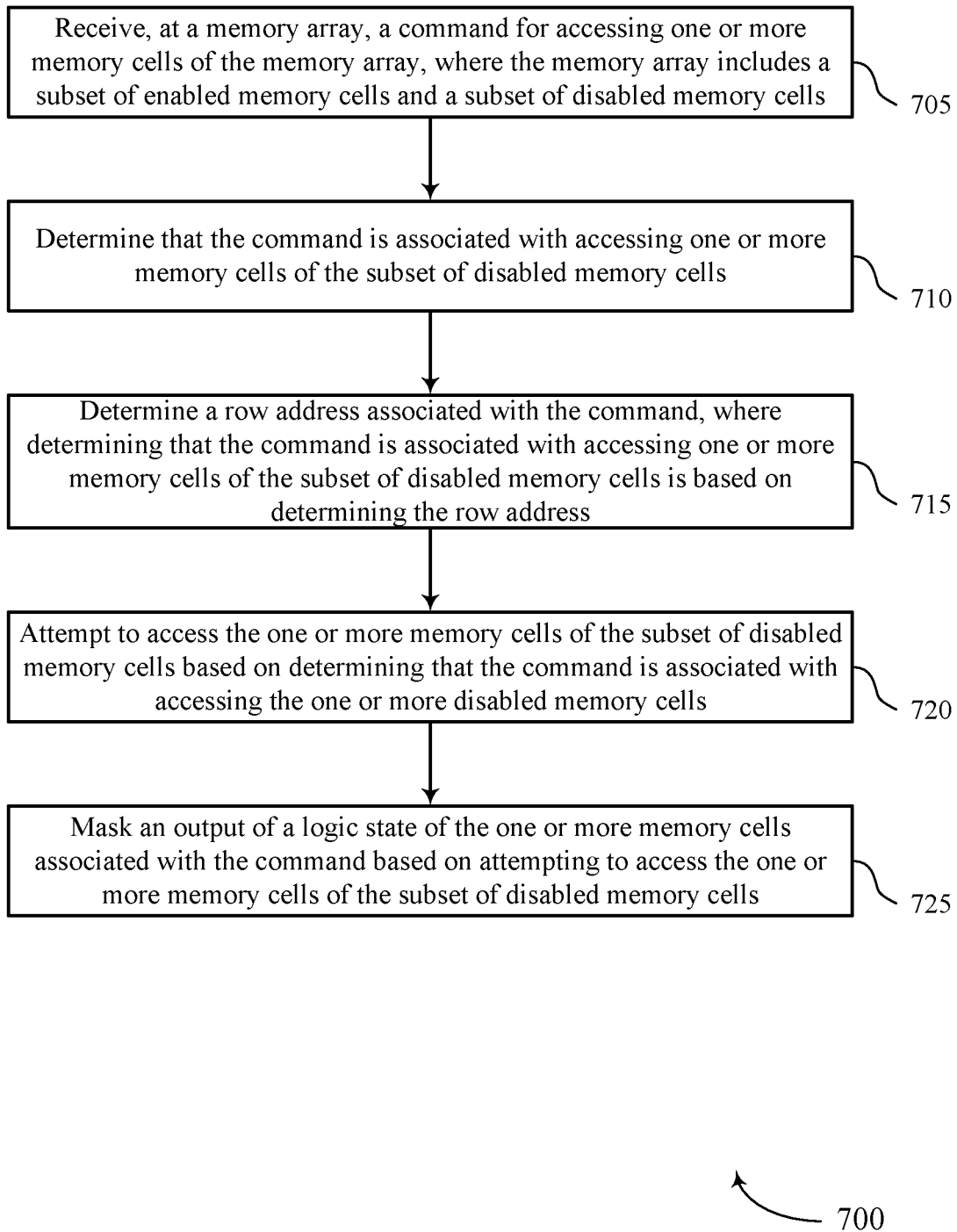

FIG. 7 shows a flowchart illustrating a method or methods 700 that supports memory read masking in accordance with examples as disclosed herein. The operations of method 700 may be implemented by a memory device or its components as described herein.

For example, the operations of method 700 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 705, the memory device may receive, at a memory array, a command for accessing one or more memory cells of the memory array, where the memory array includes a subset of enabled memory cells and a subset of disabled memory cells. The operations of 705 may be performed according to the methods described herein. In some examples, aspects of the operations of 705 may be performed by a reception component as described with reference to FIG. 5.

At 710, the memory device may determine that the command is associated with accessing one or more memory cells of the subset of disabled memory cells. The operations of 710 may be performed according to the methods described herein. In some examples, aspects of the operations of 710 may be performed by a determination component as described with reference to FIG. 5.

At 715, the memory device may determine a row address associated with the command, where determining that the command is associated with accessing one or more memory cells of the subset of disabled memory cells is based on determining the row address. The operations of 715 may be performed according to the methods described herein. In some examples, aspects of the operations of 715 may be performed by a determination component as described with reference to FIG. 5.

At 720, the memory device may attempt to access the one or more memory cells of the subset of disabled memory cells based on determining that the command is associated with accessing the one or more disabled memory cells. The operations of 720 may be performed according to the methods described herein. In some examples, aspects of the operations of 720 may be performed by an access component as described with reference to FIG. 5.

At 725, the memory device may mask an output of a logic state of the one or more memory cells associated with the command based on attempting to access the one or more memory cells of the subset of disabled memory cells. The operations of 725 may be performed according to the methods described herein. In some examples, aspects of the operations of 725 may be performed by a masking component as described with reference to FIG. 5.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a memory array including a subset of enabled memory cells and a subset of disabled memory cells and a control circuit coupled with the memory array and operable to receive a command for accessing a set of memory cells of the memory array, determine that the command is associated with the subset of disabled memory cells, attempt to access the one or more memory cells of the subset of disabled memory cells based on determining that the command is associated with the subset of disabled memory cells, and an output buffer configured to output a signal that masks one or more outputs associated with accessing the subset of disabled memory cells.

In some examples, the control circuit may be configured to receive one or more first bits to indicate that one or more errors associated with accessing the subset of disabled memory cells should be masked.

In some examples, the control circuit may be configured to receive one or more second bits to indicate whether the subset of disabled memory cells may be configured to be accessed.

Some examples of the apparatus may include a first multiplexer coupled with the control circuit and configured to enable accessing the subset of disabled memory cells based on a value of the one or more second bits, and a second multiplexer coupled with the control circuit and configured to enable accessing the subset of enabled memory cells based on a value of the one or more second bits.

In some examples, the output buffer may be configured to output a logic state of the one or more memory cells associated with the command based on accessing the one or more memory cells of the subset of enabled memory cells.

An apparatus is described. The apparatus may include a memory array including a subset of enabled memory cells and a subset of disabled memory cells, a memory controller coupled with the memory array, the memory controller configured to, determine that the command is associated with accessing one or more memory cells of the subset of disabled memory cells, initiate accessing the one or more memory cells of the subset of disabled memory cells, and mask an output of a logic state of the one or more memory cells of the subset of disabled memory cells based on an occurrence of one or more errors associated with accessing the subset of disabled memory cells.

Some examples may further include determining an occurrence of one or more errors based on initiating accessing the one or more memory cells of the subset of disabled memory cells.

Some examples of the apparatus may include generate an error flag based on the occurrence of one or more errors associated with accessing the subset of disabled memory cells, and transmit the error flag to the host device.

Some examples may further include determining a row address associated with the command, and determine a value of one or more bits associated with the memory array, where the memory controller may be configured to mask the output of the logic state of the one or more memory cells based on the row address associated with the command and the value of the one or more bits associated with the memory array.

Some examples may further include determining that a first memory cell of the subset of enabled memory cells may be redundant with a first memory cell of the subset of disabled memory cells, determine that the first memory cell of the subset of enabled memory cells may be valid based on initiating accessing the one or more memory cells of the subset of disabled memory cells, and access the first memory cell of the subset of disabled memory cells based on determining that the first memory cell may be valid and receiving a second command for accessing the first memory cell of the subset of enabled memory cells.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (e.g., majority carriers are signals), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (e.g., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    receiving, at a memory array, a command for accessing one or more memory cells of the memory array, wherein the memory array comprises a subset of enabled memory cells and a subset of disabled memory cells;
    determining that the command is associated with accessing one or more memory cells of the subset of disabled memory cells;
    attempting to access the one or more memory cells of the subset of disabled memory cells based at least in part on determining that the command is associated with accessing the one or more disabled memory cells; and masking an output of a logic state of the one or more memory cells associated with the command based at least in part on attempting to access the one or more memory cells of the subset of disabled memory cells.

2. The method of claim 1, wherein the masked output of the logic state comprises an indication that an error did not occur based on attempting to access the one or more memory cells of the subset of disabled memory cells.

3. The method of claim 1, wherein masking the output of the logic state of the one or more memory cells associated with the command comprises:

generating an indication that the one or more memory cells were successfully accessed.

4. The method of claim 1, further comprising:

determining a row address associated with the command, wherein determining that the command is associated with accessing one or more memory cells of the subset of disabled memory cells is based at least in part on determining the row address.

5. The method of claim 4, further comprising:

receiving, at the memory array, a control signal comprising one or more bits; and determining a value of the one or more bits received by the memory array, wherein masking the output of the logic state of the one or more memory cells is based at least in part on the row address associated with the command and the value of the one or more bits.

6. The method of claim 1, further comprising:

determining a first memory cell of the subset of disabled memory cells that is available for being used to store a logic state in place of a first memory cell of the subset of enabled memory cells; and determining that the first memory cell of the subset of disabled memory cells is valid based at least in part on attempting to access the one or more memory cells of the subset of disabled memory cells.

7. The method of claim 6, further comprising:

receiving, at the memory array, a second command for accessing one or more memory cells of the subset of enabled memory cells; and accessing the first memory cell of the subset of disabled memory cells based at least in part on determining that the first memory cell of the subset of disabled memory cells is valid.

8. The method of claim 1, further comprising:

generating, based at least in part on determining that the command is associated with the subset of disabled memory cells, a signal that comprises the masked output of the logic state of the one or more memory cells.

9. The method of claim 1, further comprising:

receiving, at the memory array, a third command for accessing one or more memory cells of the memory array;

determining that the third command is associated with accessing one or more memory cells of the subset of enabled memory cells;

accessing the one or more memory cells of the subset of enabled memory cells based at least in part on determining that the command is associated with accessing the one or enabled more memory cells; and outputting a logic state of the one or more memory cells associated with the command based at least in part on accessing the one or more memory cells of the subset of enabled memory cells.

10. The method of claim 9, further comprising:

accessing, for a second time, the one or more memory cells of the subset of enabled memory cells based at least in part on outputting the logic state of the one or more memory cells associated with the command.

11. An apparatus, comprising:

a memory array comprising a subset of enabled memory cells and a subset of disabled memory cells; and a control circuit coupled with the memory array and operable to:

receive a command for accessing a plurality of memory cells of the memory array;

determine that the command is associated with the subset of disabled memory cells;

attempting to access the one or more memory cells of the subset of disabled memory cells based at least in part on determining that the command is associated with the subset of disabled memory cells; and an output component configured to output a signal that masks one or more outputs associated with accessing the subset of disabled memory cells.

12. The apparatus of claim 11, wherein the control circuit is configured to receive one or more first bits to indicate that one or more errors associated with accessing the subset of disabled memory cells should be masked.

13. The apparatus of claim 11, wherein the control circuit is configured to receive one or more second bits to indicate whether the subset of disabled memory cells are configured to be accessed.

14. The apparatus of claim 13, further comprising:

a first multiplexer coupled with the control circuit and configured to enable accessing the subset of disabled memory cells based at least in part on a value of the one or more second bits; and a second multiplexer coupled with the control circuit and configured to enable accessing the subset of enabled memory cells based at least in part on a value of the one or more second bits.

15. The apparatus of claim 11, wherein the output component is configured to output an error flag indicating an error associated with one or more memory cells based at least in part on accessing the subset of enabled memory cells.

16. The apparatus of claim 11, wherein the output component comprises an output buffer, an internal register, or both.

17. An apparatus, comprising:

a memory array comprising a subset of enabled memory cells and a subset of disabled memory cells; and a testing component coupled with the memory array, the testing component configured to cause the apparatus to:

receive a command for accessing one or more memory cells of the memory array;

determine that the command is associated with accessing one or more memory cells of the subset of disabled memory cells;

initiate accessing the one or more memory cells of the subset of disabled memory cells; and mask an output of a logic state of the one or more memory cells of the subset of disabled memory cells based on an occurrence of one or more errors associated with accessing the subset of disabled memory cells.

18. The apparatus of claim 17, wherein the testing component is configured to cause the apparatus to:

determine an occurrence of one or more errors based at least in part on initiating accessing the one or more memory cells of the subset of disabled memory cells.

19. The apparatus of claim 18, wherein the testing component is configured to cause the apparatus to:
generate an error flag based on the occurrence of one or more errors associated with accessing the subset of disabled memory cells; and
transmit the error flag to the testing component.

20. The apparatus of claim 17, wherein the testing component is configured to cause the apparatus to:
determine a row address associated with the command; and
determine a value of one or more bits associated with the memory array, wherein the testing component is configured to mask the output of the logic state of the one or more memory cells based at least in part on the row address associated with the command and the value of the one or more bits associated with the memory array.

21. The apparatus of claim 17, wherein the testing component is configured to cause the apparatus to:
determine that a first memory cell of the subset of enabled memory cells is redundant with a first memory cell of the subset of disabled memory cells;
determine that the first memory cell of the subset of enabled memory cells is valid based at least in part on initiating accessing the one or more memory cells of the subset of disabled memory cells; and
access the first memory cell of the subset of disabled memory cells based at least in part on determining that the first memory cell is valid and receiving a second command for accessing the first memory cell of the subset of enabled memory cells.

* * * * *

UNITED STATES PATENT AND TRADEMARK OFFICE
CERTIFICATE OF CORRECTION

PATENT NO. : 10,930,327 B1
APPLICATION NO. : 16/773824
DATED : February 23, 2021
INVENTOR(S) : Jefferson et al.

Page 1 of 1

It is certified that error appears in the above-identified patent and that said Letters Patent is hereby corrected as shown below:

On the Title Page

Item (72) Please delete "Christopher S. Wieduwilt, Boise, ID" and insert --Christopher G. Wieduwilt, Boise, ID--

Signed and Sealed this
Sixteenth Day of November, 2021

Drew Hirshfeld
*Performing the Functions and Duties of the*
*Under Secretary of Commerce for Intellectual Property and*
*Director of the United States Patent and Trademark Office*